(12) United States Patent
Wu et al.

(10) Patent No.: US 9,362,975 B2
(45) Date of Patent: Jun. 7, 2016

(54) LOW NOISE AMPLIFIER AND METHOD FOR CARRIER AGGREGATION AND NON-CARRIER AGGREGATION

(71) Applicant: Samsung Electronics Co., Ltd., Gyeonggi-do (KR)

(72) Inventors: Jianxin Wu, Sunnyvale, CA (US);
Xiaohua Yu, San Jose, CA (US);
Sangwon Son, San Jose, CA (US);
Naveen Alluri, San Jose, CA (US)

(73) Assignee: Samsung Electronics Co., Ltd. (KR)

( * ) Notice: Subject to any disclaimer, the term of this patent is extended or adjusted under 35 U.S.C. 154(b) by 52 days.

(21) Appl. No.: 14/519,810

(22) Filed: Oct. 21, 2014

(65) Prior Publication Data

US 2016/0065264 A1    Mar. 3, 2016

Related U.S. Application Data

(60) Provisional application No. 62/043,790, filed on Aug. 29, 2014.

(51) Int. Cl.
| | |
|---|---|
| H04B 1/06 | (2006.01) |
| H03F 3/45 | (2006.01) |
| H04B 1/401 | (2015.01) |
| H03F 3/193 | (2006.01) |
| H04J 11/00 | (2006.01) |

(52) U.S. Cl.
CPC .............. *H04B 1/401* (2013.01); *H03F 3/193* (2013.01); *H04J 11/00* (2013.01); *H03F 2200/213* (2013.01); *H03F 2200/294* (2013.01); *H03F 2200/451* (2013.01)

(58) Field of Classification Search
CPC ............ H04B 1/04; H04B 1/28; H03F 1/086; H03F 1/523; H03F 1/3205; H03F 3/185; H03F 2200/18; H03F 2200/27; H03F 2200/111; H03F 2200/294; H03F 2200/451; H03G 1/0029; H03G 3/00; H03G 3/3036
USPC ......... 455/232.1, 552.1, 553.1; 330/129, 130, 330/131, 134, 135, 252, 253, 254, 261
See application file for complete search history.

(56) References Cited

U.S. PATENT DOCUMENTS

| | | | | |
|---|---|---|---|---|
| 6,377,315 | B1 * | 4/2002 | Carr ..................... | H01F 17/0006 455/179.1 |
| 6,509,796 | B2 * | 1/2003 | Nguyen ................ | H03F 1/3211 330/254 |
| 6,684,065 | B2 * | 1/2004 | Bult ....................... | H03F 3/195 330/254 |
| 8,412,139 | B2 * | 4/2013 | Park .................... | H04L 27/2647 455/553.1 |
| 8,416,758 | B1 * | 4/2013 | Rousu ...................... | H04B 1/18 455/338 |
| 8,514,021 | B2 | 8/2013 | Heikkinen et al. | |
| 8,548,410 | B2 | 10/2013 | Jussila et al. | |
| 8,606,194 | B2 | 12/2013 | Kaukovuori et al. | |
| 2013/0265892 | A1 | 10/2013 | Fernando | |
| 2014/0170999 | A1 | 6/2014 | Aparin | |

* cited by examiner

*Primary Examiner* — Quochien B Vuong
(74) *Attorney, Agent, or Firm* — The Farrell Law Firm, P.C.

(57) ABSTRACT

A low noise amplifier for carrier aggregation and non-carrier aggregation is provided. The low noise amplifier includes a plurality of symmetrical half circuits, a plurality of bias circuits, where each of the plurality of bias circuits is connected to one of the plurality of symmetrical half circuits, a plurality of capacitors, where each of the plurality of capacitors is connected to one of the plurality of symmetrical half circuits for Alternating Current (AC) coupling an RF signal containing at least one component carrier, and a control logic circuit connected to each of the plurality of symmetrical half circuits for configuring the low noise amplifier to process one component carrier or a plurality of component carriers.

20 Claims, 5 Drawing Sheets

LOW NOISE AMPLIFIER AND METHOD FOR CARRIER AGGREGATION AND NON-CARRIER AGGREGATION

PRIORITY

This application claims priority under 35 U.S.C. §119(a) to a U.S. Provisional Patent Application filed on Aug. 29, 2014 in the United States Patent and Trademark Office and assigned Ser. No. 62/043,790, the entire contents of which are incorporated herein by reference.

BACKGROUND OF THE INVENTION

1. Field of the Invention

The present invention relates generally to a low noise amplifier, and more particularly, to a low noise amplifier for carrier aggregation and non-carrier aggregation.

2. Description of the Related Art

Long Term Evolution (LTE) Advanced is a high-speed wireless communication standard for mobile phones and data terminals. To achieve high speed, transmission bandwidth is increased over that which can be achieved using a single carrier or channel. The method is commonly referred to as Carrier Aggregation (CA), where more than one carrier, or component carrier, are aggregated to increase the effective transmission bandwidth.

Carrier aggregation may be performed in one band (i.e., intra-band carrier aggregation) or in multiple bands (i.e., inter-band carrier aggregation).

In intra-band carrier aggregation, the component carriers may be contiguous (i.e., adjacent to each other) or non-contiguous. In inter-band carrier aggregation, the component carriers are non-contiguous.

An aggregated channel in which carrier aggregation is contiguous appears, from a Radio Frequency (RF) perspective, as a single channel, where only one transceiver is required to process the aggregated signal. However, when carrier aggregation is non-contiguous, the prior art requires more than one transceiver to process the aggregated signal.

SUMMARY OF THE INVENTION

The present invention has been made to address the above-mentioned problems and disadvantages, and to provide at least the advantages described below.

Accordingly, an aspect of the present invention is to provide a low noise amplifier that supports carrier aggregation mode and non-carrier aggregation mode.

Another aspect of the present invention is to provide a low noise amplifier with independent path active gain control.

Another aspect of the present invention is to provide a low noise amplifier with independent bias voltage control.

Another aspect of the present invention is to provide a low noise amplifier with a switched source degenerating inductor.

Another aspect of the present invention is to provide a low noise amplifier with a source degenerating capacitor.

Another aspect of the present invention is to provide a low noise amplifier that uses multiple paths for signals with multiple transmissions.

In accordance with an aspect of the present invention, a low noise amplifier for carrier aggregation and non-carrier aggregation is provided. The low noise amplifier includes a plurality of symmetrical half circuits, a plurality of bias circuits, where each of the plurality of bias circuits is connected to one of the plurality of symmetrical half circuits, a plurality of capacitors, where each of the plurality of capacitors is connected to one of the plurality of symmetrical half circuits for Alternating Current (AC) coupling an RF signal containing at least one component carrier, and a control logic circuit connected to each of the plurality of symmetrical half circuits for configuring the low noise amplifier to process one component carrier or a plurality of component carriers.

In accordance with another aspect of the present invention, a method of low noise amplification in non-carrier aggregation mode is provided. The method includes directing one output current of a low noise amplifier to a source of one NFET of a first group of upper NFETs, a source of a first lower NFET, a source of one NFET of a second group of upper NFETs, a source of a second lower NFET, a source of one NFET of a third group of upper NFETs, and a source of a third lower NFET by applying a logic 1 voltage to a gate of the one NFET of the first group of upper NFETs, a gate of the one NFET of the second group of upper NFETs, and a gate of the one NFET of the third group of upper NFETs, while applying a logic 0 voltage to gates of the other NFETs in the first group of upper NFETs, gates of the other NFETs in the second group of upper NFETs, and gates of the other NFETs in the third group of upper NFETs.

In accordance with another aspect of the present invention, a method of low noise amplification in carrier aggregation mode is provided. The method includes directing one output current of a low noise amplifier to a source of one NFET of a first group of upper NFETs and a source of a first lower NFET; directing a second output current of the low noise amplifier to a source of one NFET of a second group of upper NFETs and a source of a second lower NFET; and directing a third output current of the low noise amplifier to a source of one NFET of a third group of upper NFETs and a source of the third lower NFET, by applying a logic 1 voltage to a gate of the one NFET in the first group of upper NFETs, a gate of the one NFET of the second group of upper NFETs, and a gate of the one NFET of the third group of upper NFETs, while applying a logic 0 voltage to gates of the other NFETs in the first group of upper NFETs, gates of the other NFETs in the second group of upper NFETs, and gates of the other NFETs in the third group of upper NFETs.

BRIEF DESCRIPTION OF THE DRAWINGS

The above and other aspects, features, and advantages of the present invention will be more apparent from the following detailed description, taken in conjunction with the accompanying drawings, in which.

DETAILED DESCRIPTION OF EMBODIMENTS OF THE PRESENT INVENTION

Figure 1:
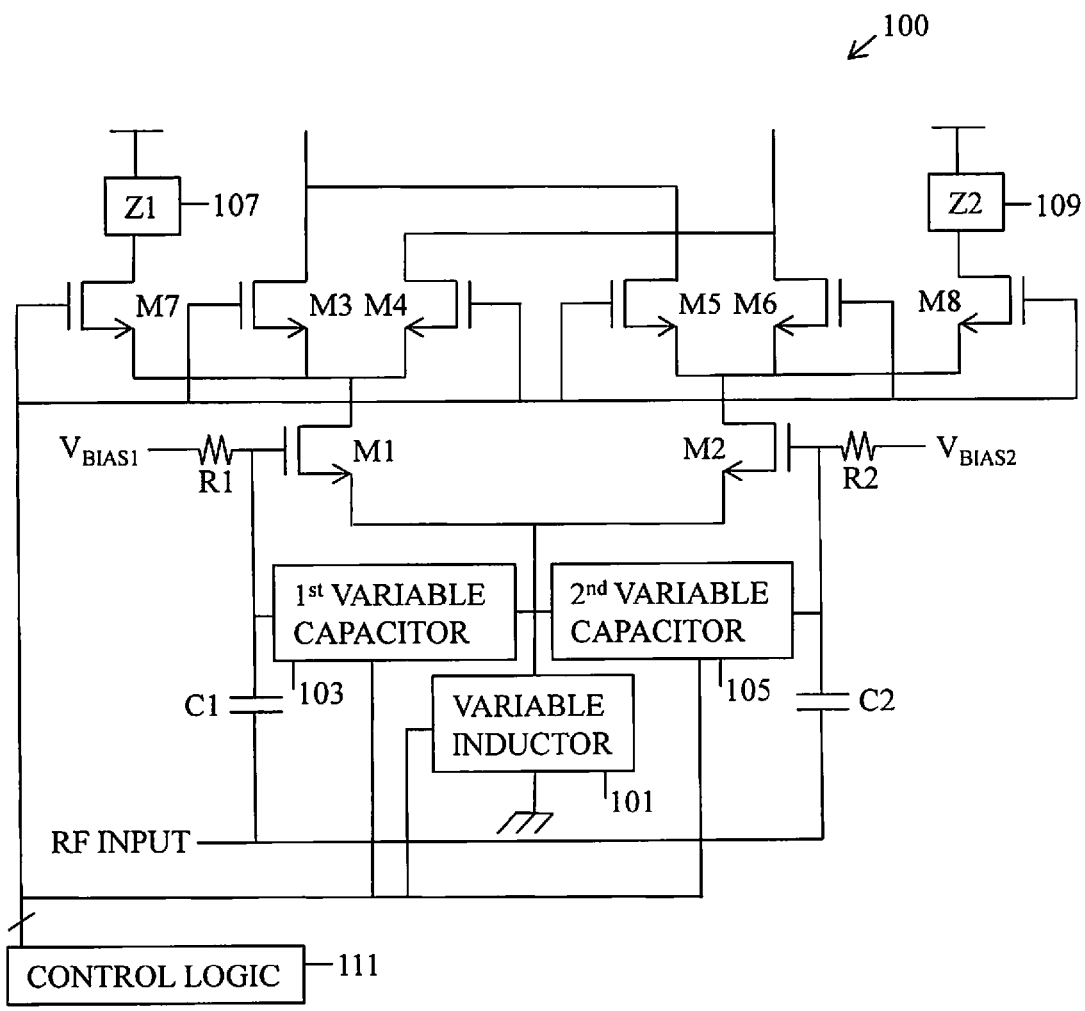
FIG. 1 is a schematic diagram of a low noise amplifier according to an embodiment of the present invention.

Hereinafter, embodiments of the present invention are described in detail with reference to the accompanying drawings. It should be noted that the same elements will be designated by the same reference numerals although they are shown in different drawings. In the following description, specific details such as detailed configurations and components are merely provided to assist the overall understanding of the embodiments of the present invention. Therefore, it should be apparent to those skilled in the art that various changes and modifications of the embodiments described herein may be made without departing from the scope and spirit of the present invention. In addition, descriptions of well-known functions and constructions are omitted for clarity and conciseness. The terms described below are terms defined in consideration of the functions in the present invention, and may be different according to users, intentions of the users, or customs. Therefore, the definitions of the terms should be determined based on the contents throughout the specification.

The present invention may have various modifications and various embodiments, among which embodiments will now be described in detail with reference to the accompanying drawings. However, it should be understood that the present invention is not limited to the embodiments, but the present invention includes all modifications, equivalents, and alternatives within the spirit and the scope of the present invention.

Although the terms including an ordinal number such as first, second, etc. may be used for describing various elements, the structural elements are not restricted by the terms. The terms are only used to distinguish one element from another element. For example, without departing from the scope of the present invention, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present invention but are not intended to limit the present invention. Singular forms are intended to include plural forms unless the context clearly indicates otherwise. In the description, it should be understood that the terms "include" or "have" indicate existence of a feature, a number, a step, an operation, a structural element, parts, or a combination thereof, and do not exclude the existence or probability of addition of one or more other features, numerals, steps, operations, structural elements, parts, or combinations thereof.

Unless defined differently, all terms used herein, which include technical terminologies or scientific terminologies, have the same meaning as that understood by a person skilled in the art to which the present invention belongs. Such terms as those defined in a generally used dictionary are to be interpreted to have meanings equal to the contextual meanings in the relevant field of art, and are not to be interpreted to have ideal or excessively formal meanings unless clearly defined in the present specification.

Although the following description of the embodiments of the present invention uses terms and names defined for n-channel Metal Oxide Semiconductor (MOS) Field Effect Transistors (FETs) (i.e., n-channel MOSFET, NMOS, or NFET), the present invention is not limited by these terms and names, and is identically applicable to other similar systems (e.g., p-channel MOSFETS, or PFETs, and Complementary MOS (CMOS), where CMOS uses both NFETs and PFETs).

The present invention relates to a Low Noise Amplifier (LNA) that supports carrier aggregation and non-carrier aggregation, and provides independent bias and gain control of each individual channel. The LNA may be configured to receive either an RF signal containing a single carrier (i.e., non-carrier aggregation, or normal, mode) or an RF signal containing at least two carriers (i.e., carrier aggregation mode), where the carriers may be intra-band, inter-band, contiguous, or non-contiguous. In carrier aggregation mode, the bias current and gain of each carrier in the received signal may be independently controlled.

In CA mode, each channel provides independent bias current control and gain control, which is not disclosed in the prior art. When CA mode is not enabled (i.e., in normal mode), the LNA behaves as a single LNA. Gain control is realized by either diverting the LNA signal current or by varying a bias current.

The LNA may interface between an RF-analog receiver and circuitry for extracting a baseband signal.

The two or more CA channels, or component carriers, in an NFET embodiment of the present invention share one common source degenerating inductor. One degenerating inductor is shared by two or more CA channels in a PFET embodiment of the present invention. However, for a CMOS embodiment of the present invention, two degenerating inductors are used.

The source degenerating inductor is switchable to vary its inductance between CA mode and non-CA mode to maintain a good trade-off between input matching, noise figure, and gain, and may be fabricated in an integrated circuit in an area-efficient manner by using stacked metals layers. One source degenerating inductor may be shared among several LNAs. A gate-source capacitance may also be switched to maintain a good trade-off between input matching and noise figure.

The LNA of the present invention can process component carriers with widely imbalanced power levels or blocking levels.

FIG. 1 is a schematic diagram of a Low Noise Amplifier (LNA) 100 according to an embodiment of the present invention that illustrates two processing channels. However, the present invention is not limited to an LNA 100 having only two channels. The LNA 100 of the present invention may have n channels, where n is a user defined integer. In carrier aggregation mode, each channel in the LNA 100 may process either one of the aggregated component carriers or more than one aggregated component carrier.

Referring to FIG. 1, the LNA 100 includes a first lower NFET M1 and a second lower NFET M2. The first lower NFET M1 and the second lower NFET M2 are connected via their drains. NFETs are described for illustrative purposes only, and the present invention is not limited to an LNA 100 that uses only NFETs. The LNA 100 of the present invention may be implemented in either PFET or CMOS technology, where CMOS technology uses both NFETs and PFETs.

The first lower NFET M1 is independently biased with a Direct Current (DC) voltage via a first resistor R1, which is connected between a first bias voltage $V_{BIAS1}$ and the gate of the first lower NFET M1. The first lower NFET M1 is also Alternating Current (AC) coupled to an RF input via a first capacitor C1, which is connected between the RF input and the gate of the first lower NFET M1. The first lower NFET M1 acts as a transconductor, which converts an RF input voltage to a current. In LTE Advanced, the RF input signal may contain one component carrier in normal mode or two or more component carriers in carrier aggregation mode.

The second lower NFET M2 is independently biased with a DC voltage via a second resistor R2, which is connected between a second bias voltage $V_{BIAS2}$ and the gate of the second lower NFET M2. The second lower NFET M2 is also AC coupled to the RF input via a second capacitor C2, which is connected between the RF input and the gate of the second lower NFET M2. The second lower NFET M2 acts as a transconductor, which converts the RF input voltage to a current.

The values of $V_{BIAS1}$ and $V_{BIAS2}$ are individually chosen so that the bias current of the first lower NFET M1 and the bias current of the second lower NFET M2 are independently controlled. That is, the bias currents of the first lower NFET M1 and the second lower NFET M2 may be the same as, or different from, each other, depending on the values chosen for $V_{BIAS1}$ and $V_{BIAS2}$.

The LNA 100 includes a first pair of upper NFETs M3, M4 and a second pair of upper NFETs M5, M6, where the drains of the first pair of upper NFETs M3, M4 are connected to the source of the first lower NFET M1, and where the drains of the second pair of upper NFETs M5, M6 are connected to the source of the second lower NFET M2. The source of the first NFET M3 in the first pair of upper NFETs M3, M4 is connected to the source of the first NFET M5 in the second pair of upper NFETs M5, M6. The source of the second NFET M4 in the first pair of upper NFETs M3, M4 is connected to the source of the second NFET M6 in the second pair of upper NFETs M5, M6. The gates of the first pair of upper NFETs M3, M4 and the second pair of upper NFETs M5, M6 each receive a control input so that each of the NFETs M3, M4, M5, and M6 may be individually controlled (i.e., individually turned on or off) to configure the LNA 100 in either normal, or non-carrier aggregation, mode or carrier aggregation mode, as described below. The first pair of upper NFETs M3, M4 and the first lower NFET M1 form a first symmetrical half circuit. The second pair of upper NFETs M5, M6 and the second lower NFET M2 form a second symmetrical half circuit.

The first upper pair of NFETs M3, M4 and the second upper pair of NFETs M5, M6 are either turned on or off by applying an appropriate voltage (e.g., a high, logic 1 voltage referred to as VDD or a low, logic 0 voltage referred to as ground or GND) to the gates of the first and second upper pairs of NFETs M3, M4, and M5, M6 via a control input.

In normal mode (i.e., non-carrier aggregation mode), one output current of the LNA 100 is directed to the source of NFET M3 of the first upper pair of NFETs M3, M4 (and the source of the first lower NFET M1) and the source of NFET M5 of the second upper pair of NFETs M5, M6 (and the source of the second lower NFET M2) by applying a high voltage to the gate of NFET M3 and the gate of NFET M5, while applying a low voltage to the gate of NFET M4 and the gate of NFET M6.

In normal mode (i.e., non-carrier aggregation mode), one output current of the LNA 100 may also be directed to the source of M4 of the first upper pair of NFETs M3, M4 (and the source of the first lower NFET M1) and the source of NFET M6 of the second upper pair of NFETs M5, M6 (and the source of the second lower NFET M2) by applying a high voltage to the gate of NFET M4 and the gate of NFET M6, while applying a low voltage to the gate of NFET M3 and the gate of NFET M5.

In carrier aggregation mode, one output current of the LNA 100 is directed to the source of NFET M3 of the first upper pair of NFETs M3, M4 (and the source of the first lower NFET M1) and a second output current of the LNA 100 is directed to the source NFET M6 of the second upper pair of NFETs M5, M6 (and the source of the second lower NFET M2) by applying a high voltage to the gate of NFET M3 and the gate of NFET M6, while applying a low voltage to the gate of NFET M4 and the gate of NFET M5. The first output current and the second output current may each contain one or more component carriers, which may be converted to base-band as described below with reference to FIG. 5. If each output current contains one component carrier, then the LNA 100 of FIG. 1 processes two aggregated component carriers. However, the present invention is not limited to processing just two aggregated component carriers, where each symmetrical half circuit processes one output current containing one component carrier. Additional aggregated component carriers may be processed by the present invention by either including more than one component carrier in an output current or adding additional symmetrical half circuits, as illustrated in FIG. 6 and described below, to process additional output currents, where an additional output current may contain one or more component carriers.

The LNA 100 of FIG. 1 includes a variable inductor 101 connected between the drains of the first lower NFET M1 and the second lower NFET M2 and a low voltage (e.g., GND), where the variable inductor 101 receives a control input for varying the value of the variable inductor 101. The variable inductor 101 acts as a switched source degenerating inductor. In normal mode, the variable inductor 101 has a first value when the control input has a first value (e.g., a low voltage GND or logic 0). In carrier aggregation mode, the variable inductor 101 has a second value that is less than the first value when the control input has a second value (e.g., a high voltage VDD or logic 1). Different values may be used for the control input to achieve the same result (e.g., VDD for the first value of the variable inductor 101 and GND for the second value of the variable inductor 101). In carrier aggregation mode, the second value of the variable inductor 101 provides optimal LNA 100 input impedance matching, gain, and noise figure.

The LNA 100 includes a first variable capacitor 103 connected between the gate and the drain of the first lower NFET M1, where the first variable capacitor 103 receives a control input for varying the value of the first variable capacitor 103. The first variable capacitor 103 acts as a switched source degenerating capacitor. In normal mode, the first variable capacitor 103 has a first value. In carrier aggregation mode, the first variable capacitor 103 has a second value that is lower than the first value of the first variable capacitor 103. Alternatively, the first variable capacitor 103 may have a fixed value for both normal mode and carrier aggregation mode. However, to process a wider RF frequency range using a single LNA 100, a first variable capacitor 103 having a first value and a second value is preferred to provide good LNA 100 input matching and noise figure. In normal mode, the first variable capacitor 103 has a first value when the control input has a first value (e.g., a low voltage GND or logic 0). In carrier aggregation mode, the first variable capacitor 103 has a second value that is less than the first value when the control input has a second value (e.g., a high voltage VDD or logic 1). Different values may be used for the control input to achieve the same result (e.g., VDD for the first value of the first variable capacitor 103 and GND for the second value of the first variable capacitor 103).

The LNA 100 includes a second variable capacitor 105 connected between the gate and the drain of the second lower NFET M2, where the second variable capacitor 105 receives a control input for varying the value of the second variable capacitor 105. The second variable capacitor 105 acts as a switched source degenerating capacitor. In normal mode, the second variable capacitor 105 has a first value. In carrier aggregation mode, the second variable capacitor 105 has a second value that is lower than the first value of the second variable capacitor 105. Alternatively, the second variable capacitor 105 may have a fixed value for both normal mode and carrier aggregation mode. However, to process a wider RF frequency range using a single LNA 100, a second variable capacitor 105 having a first value and a second value is preferred to provide good LNA 100 input matching and noise figure. In normal mode, the second variable capacitor 105 has a first value when the control input has a first value (e.g., a low voltage GND or logic 0). In carrier aggregation mode, the second variable capacitor 105 has a second value that is less than the first value when the control input has a second value (e.g., a high voltage VDD or logic 1). Different values may be used for the control input to achieve the same result (e.g., VDD for the first value of the second variable capacitor 105 and GND for the second value of the second variable capacitor 105).

The LNA 100 includes a first diverting NFET M7 and a first diverting impedance Z1 107. The drain of the first diverting NFET M7 is connected to the drains of the first upper pair of NFETS M3, M4. The first diverting impedance 107 is connected between the source of the first diverting NFET M7 and a high voltage (e.g., VDD). The gate of the first diverting NFET M7 receives a control input from control logic 111 for diverting, or bleeding off, a fraction of the current in the first symmetrical half circuit formed by the first pair of upper NFETs M3, M4 and the first lower NFET M1. The fraction of current diverted by the first diverting NFET M7 and the first diverting impedance Z1 107 depends on the degree to which the first diverting NFET M7 is turned on by the control input and the value of the first diverting impedance Z1 107. The first diverting impedance Z1 107 may be any device that has an impedance (e.g., a passive component such as a resistor formed in any material having a resistance, an active component such as an NFET connected in a diode configuration, etc.). The amount of current diverted from the first symmetrical half circuit affects the gain of the first symmetrical half circuit (i.e., the more current diverted the lower the gain).

The LNA 100 includes a second diverting NFET M8 and a second diverting impedance Z2 109. The drain of the second diverting NFET M8 is connected to the drains of the second upper pair of NFETS M5, M6. The second diverting impedance Z2 109 is connected between the source of the second diverting NFET M8 and a high voltage (e.g., VDD). The gate of the second diverting NFET M8 receives a control input from control logic 111 for diverting, or bleeding off, a fraction of the current in the second symmetrical half circuit formed by the second pair of upper NFETs M5, M6 and the second lower NFET M2. The fraction of current diverted by the second diverting NFET M8 and the second diverting impedance Z2 109 depends on the degree to which the second diverting NFET M8 is turned on by the control input and the value of the second diverting impedance Z2 109. The second diverting impedance Z2 109 may be any static component or active device that has an impedance (e.g., a passive component such as a resistor formed in any material having a resistance, an active component such as an NFET connected in a diode configuration, etc.). The amount of current diverted from the second symmetrical half circuit affects the gain of the second symmetrical half circuit (i.e., the more current diverted the lower the gain).

The control inputs to the first diverting NFET M7 and the second diverting NFET M8 are independently controlled, which enables the gain of the first symmetrical half circuit and the gain of the second symmetrical half circuit to be independently controlled.

The LNA 100 includes control logic 111 having an output bus that provides individual control inputs for each of the first pair of upper NFETs M3, M4, each of the second pair of upper NFETs M5, M6, the variable inductor 101, the first variable capacitor 103, the second variable capacitor 105, the first diverting NFET M7, and the second diverting NFET M8. The control logic 111 controls the mode (i.e., normal mode or carrier aggregation mode), the bias current, and the gain of the LNA 100.

The LNA 100 may be integrated into a receiver. In addition, an array of LNAs 100 may be interconnected to an array of mixers and baseband analog blocks, where any RF input signal, either in CA mode or normal mode, may be routed to any mixer and baseband analog block. Multiple RF carriers from a receiving antenna may be processed by a single LNA 100 in CA mode.

Figure 2:
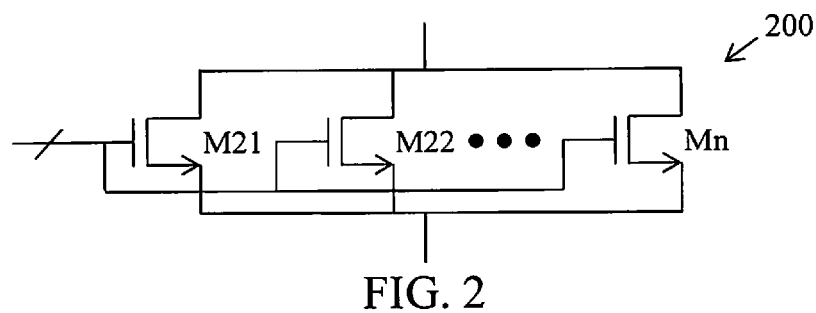
FIG. 2 is a schematic diagram of a transistor array according to an embodiment of the present invention.

FIG. 2 is a schematic diagram of a transistor array 200 according to an embodiment of the present invention.

Referring to FIG. 2, the transistor array 200 includes n NFETs M21, M22, . . . , Mn connected in parallel. The sources of the n NFETs M21, M22, . . . , Mn are connected to form a collective source of the transistor array 200. The drains of the n NFETs M21, M22, . . . , Mn are connected to form a collective drain of the n NFETs M21, M22, . . . , Mn. Each of the gates of the n NFETs M21, M22, . . . , Mn is connected to one of n control inputs so that each of the n NFETs M21, M22, . . . , Mn is individually controlled. Each NFET of FIG. 1 may be replaced with a transistor array 200 of FIG. 2. In an alternate embodiment, the transistor array 200 may be an array of n PFETs connected in parallel. Thus, for a PFET or CMOS version of the LNA 100 of FIG. 1, each PFET may be replaced with a transistor array 200 of n PFETs. The length and widths of the transistors in the transistor array are individually settable to achieve a desired operating frequency. For example, the lengths and widths (i.e., L/W) of the transistors may be individually settable to achieve a frequency of operation over various frequency ranges such as 700-1500 MHz, 1700-2300 MHz, and 2300-2700 MHZ. However, other operating frequency ranges are possible.

Figure 3A:
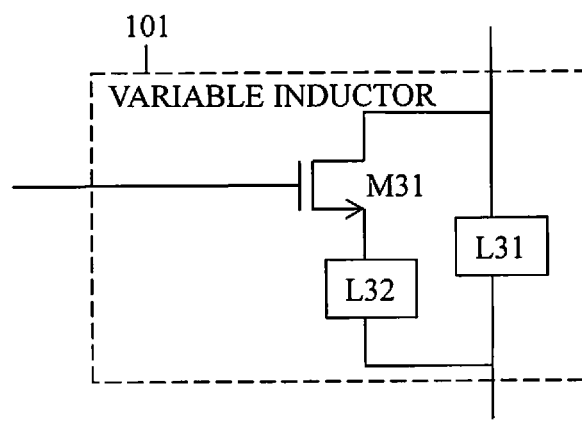
FIG. 3A is a schematic diagram of a variable inductor according to an embodiment of the present invention.

FIG. 3A is a schematic diagram of a variable inductor 101 according to an embodiment of the present invention.

Referring to FIG. 3A, the variable inductor 101 includes a first inductor L31, a second inductor L32, and an NFET M31. A first end of the first inductor L31 is a first output of the variable inductor 101, and a second end of the first inductor L31 is a second output of the variable inductor 101. A first end of the second inductor L32 is connected to the second end of the first inductor L31, and a second end of the second inductor L32 is connected to the drain of the NFET M31. The source of the NFET M31 is connected to the first end of the first inductor L31, and the gate of the NFET M31 is a control input to the variable inductor 101. When the control input to the variable inductor 101 is a sufficiently low voltage to not turn on the NFET M31 (e.g., GND or logic 0), then the NFET M31 does not couple the second end of the second inductor L32 to the first end of the first inductor L31, and the inductance of the variable inductor is equal to the first inductor L31. When the control input to the variable inductor 101 is a sufficiently high voltage to turn on the NFET M31 (e.g., VDD or logic 1), then the NFET M31 couples the second end of the second inductor L32 to the first end of the first inductor L31, and the inductance of the variable inductor is equal to the first inductor L31 in parallel with the second inductor L32 (i.e., (L31×L32)/(L31+L32)), which provides optimized LNA input impedance match, gain, and noise figure. The values of the inductors L31 and L32 are user-definable. If L31=L32 when the NFET M31 is turned on, then the inductance of the variable inductor is equal to L31/2. As described above, carrier aggregation mode uses the smaller of the two inductances. Thus, the NFET M31 is turned on in carrier aggregation mode and turned off in non-carrier aggregation mode. Other inductor configurations are possible so long as the variable inductor switches between a sufficiently large valued inductor and a sufficiently small valued inductor. In addition, a PFET may be used as the coupling transistor. When the NFET M31 is turned on during carrier aggregation mode, it has a finite on-resistance, which should be minimized to reduce its negative effect on the quality factor of the overall variable inductor 101. To save layout area, the first inductor L31 and the second inductor L32 may be fabricated using stacked metal layers in an integrated circuit, so long as any increase in the parasitic capacitances of the stacked metal layers are tolerable.

Figure 3B:
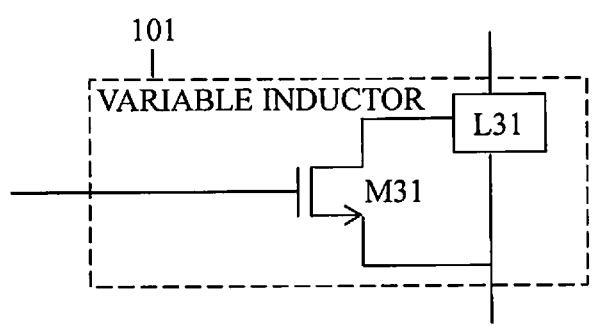
FIG. 3B is a schematic diagram of a variable inductor according to an embodiment of the present invention.

FIG. 3B is a schematic diagram of a variable inductor 101 according to an embodiment of the present invention.

Referring to FIG. 3B, the variable inductor 101 includes an inductor L31 and an NFET M31. A first end of the inductor L31 is a first output of the variable inductor 101, and a second end of the inductor L31 is a second output of the variable inductor 101. The second end of the inductor L31 is connected to the drain of the NFET M31. The source of the NFET M31 is connected to a user-definable tap of the first inductor L31, where the tap divides the value of the inductor L31 in a user-defined proportion. The gate of the NFET M31 is a control input to the variable inductor 101. When the control input to the variable inductor 101 is a sufficiently low voltage to not turn on the NFET M31 (e.g., GND or logic 0), then the NFET M31 does not couple the tap of the inductor L31 to the first end of the inductor L31, and the inductance of the variable inductor is equal to the inductor L31. When the control input to the variable inductor 101 is a sufficiently high voltage to turn on the NFET M31 (e.g., VDD or logic 1), then the NFET M31 couples the tap of the inductor L31 to the first end of the first inductor L31, and the inductance of the variable inductor is equal to the portion of the inductor L31 between the first output and the tap. The tap of the inductor L31 is user-definable. As described above, carrier aggregation mode uses the smaller of the two inductances. Thus, the NFET M31 is turned on in carrier aggregation mode and turned off in non-carrier aggregation mode. Other inductor configurations are possible so long as the variable inductor switches between a sufficiently large valued inductor and a sufficiently small valued inductor. In addition, a PFET may be used as the coupling transistor. When the NFET M31 is turned on during carrier aggregation mode, it has a finite on-resistance, which should be minimized to reduce its negative effect on the quality factor of the overall variable inductor 101. To save layout area, the inductor L31 may be fabricated using stacked metal layers in an integrated circuit, so long as any increase in the parasitic capacitances of the stacked metal layers are tolerable.

Figure 4:
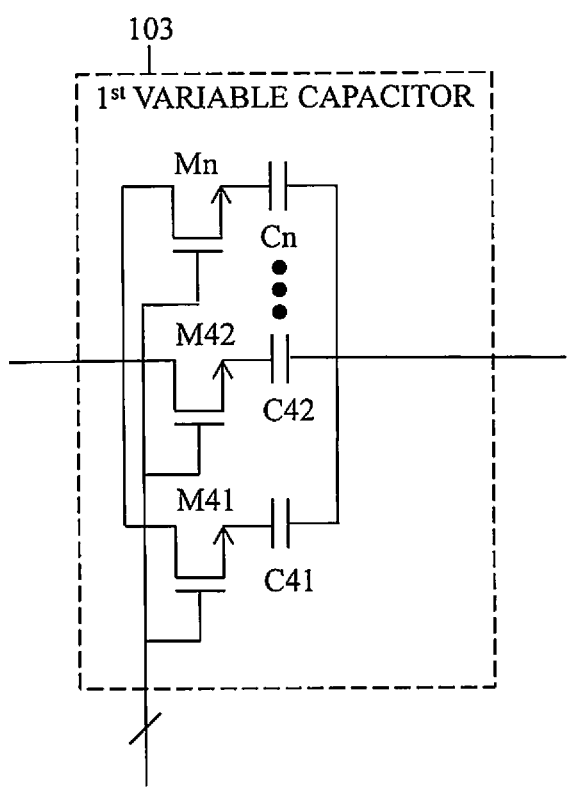
FIG. 4 is a schematic diagram of a variable capacitor according to an embodiment of the present invention.

FIG. 4 is a schematic diagram of the first variable capacitor 103 according to an embodiment of the present invention.

Referring to FIG. 4, the first variable capacitor 103 includes n capacitors C41, C42, . . . , Cn and n NFETs M41, M42, . . . , Mn. First ends of the n capacitors C41, C42, . . . , Cn are connected and form a first end of the first variable capacitor 103. Each second end of the n capacitors is connected to one of the drains of the n NFETs M41, M42, . . . , Mn. The sources of the n NFETs M41, M42, . . . , Mn are connected and form a second end of the first variable capacitor 103. Each gate of the n NFETs is connected to one of n control inputs, where each of the n control inputs controls one of the n NFETs. If an NFET is turned on by a control input (i.e., the control input is VDD or logic 1), then the capacitor connected to the NFET is added in parallel between the first end and the second end of the first variable capacitor 103. Since capacitors sum in parallel, the capacitance of the first variable capacitor 103 is the sum of the capacitors connected to the NFETs that are turned on. The value of each of the n capacitors C41, C42, . . . , Cn is user definable. The size of the NFETs M41, M42, . . . Mn should be optimized with regard to on-resistance and parasitic capacitances. Furthermore, PFETs may be used in the first variable capacitor 103. The second variable capacitor 105 may have the same structure as the first variable capacitor 103.

Figure 5:
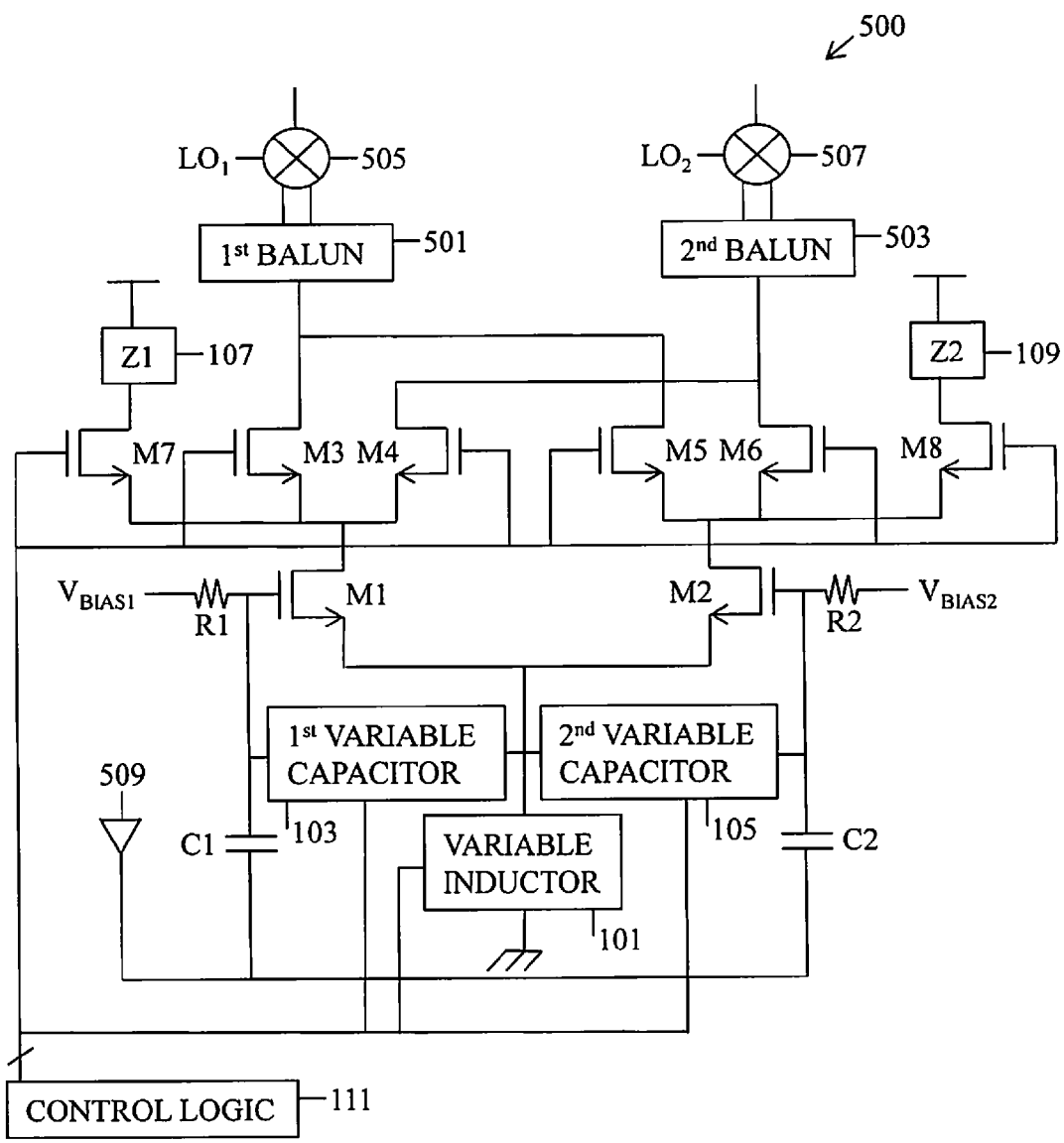
FIG. 5 is a schematic diagram of a low noise amplifier according to an embodiment of the present invention configured to support carrier aggregation and non-carrier aggregation.
Figure 6:
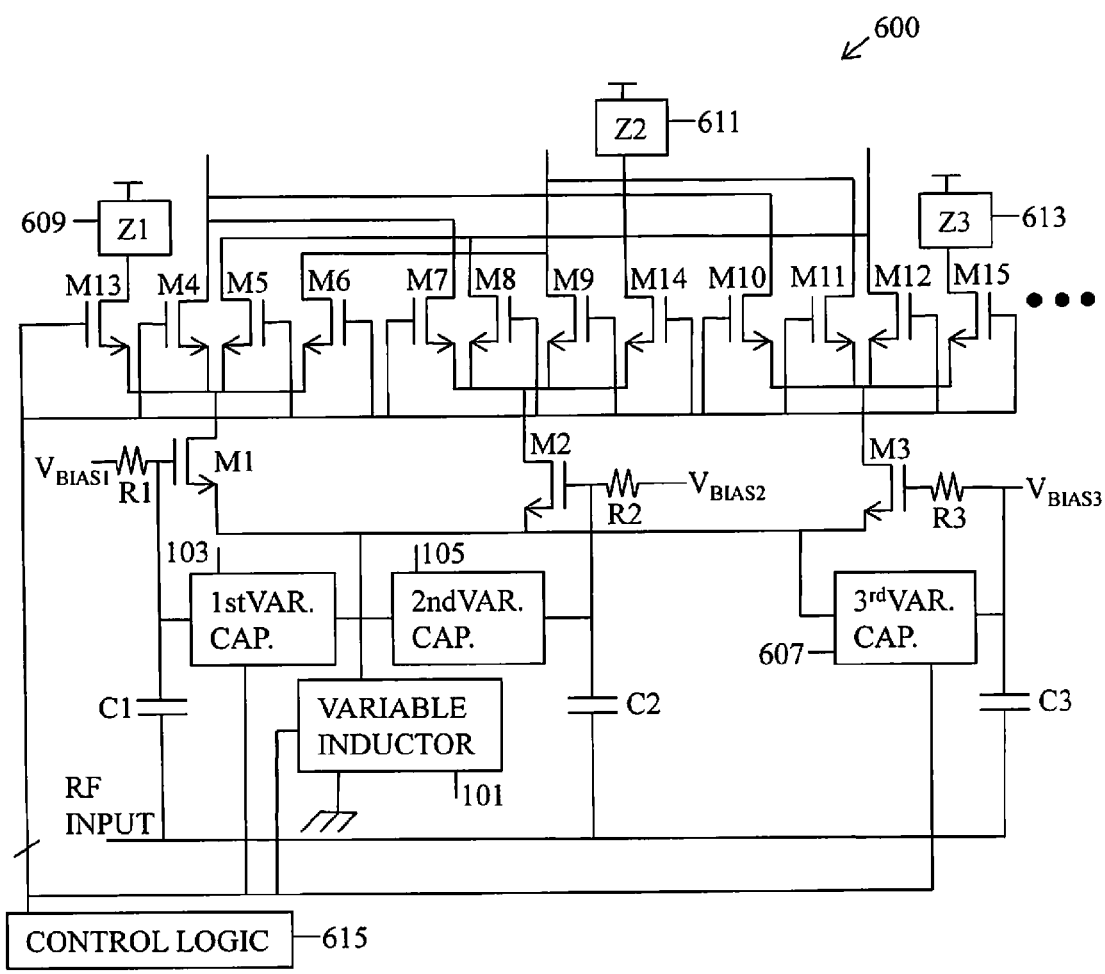
FIG. 6 is a schematic diagram of an n-channel low noise amplifier according to an embodiment of the present invention.

FIG. 5 is a schematic diagram of a Low Noise Amplifier (LNA) 500 according to an embodiment of the present invention configured to support carrier aggregation and non-carrier aggregation. However, the present is not limited to an LNA 500 having only two channels. The LNA 500 of the present invention may have n channels, where n is a user defined integer. In carrier aggregation mode, each channel in the LNA 500 may process either one of the aggregated component carriers or more than one of the aggregated component carriers.

Referring to FIG. 5, the LNA 500 includes a first lower NFET M1 and a second lower NFET M2. The first lower NFET M1 and the second lower NFET M2 are connected via their drains. NFETs are described for illustrative purposes only, and the present invention is not limited to an LNA 500 that uses only NFETs. The LNA 500 of the present invention may be implemented in either PFET or CMOS technology.

The first lower NFET M1 is independently biased with a DC voltage via a first resistor R1, which is connected between a first bias voltage $V_{BIAS1}$ and the gate of the first lower NFET M1. The first lower NFET M1 is also AC coupled to an antenna 509 for receiving an RF input via a first capacitor C1, which is connected between the antenna 509 and the gate of the first lower NFET M1. The first lower NFET M1 acts as a transconductor, which converts an RF input voltage to a current. In LTE Advanced, the RF input signal may contain one component carrier in normal mode or more than one component carrier in carrier aggregation mode.

The second lower NFET M2 is independently biased with a DC voltage via a second resistor R2, which is connected between a second bias voltage $V_{BIAS2}$ and the gate of the second lower NFET M2. The second lower NFET M2 is also AC coupled to the antenna 509 to receive an RF input via a second capacitor C2, which is connected between the RF input and the gate of the second lower NFET M2. The second lower NFET M2 acts as a transconductor, which converts the RF input voltage to a current.

The values of $V_{BIAS1}$ and $V_{BIAS2}$ are individually chosen so that the bias current of the first lower NFET M1 and the bias current of the second lower NFET M2 are independently controlled. That is, the bias currents of the first lower NFET M1 and the second lower NFET M2 may be the same as, or different from, each other, depending on the values chosen for $V_{BIAS1}$ and $V_{BIAS2}$.

The LNA 500 includes a first pair of upper NFETs M3, M4 and a second pair of upper NFETs M5, M6, where the drains of the first pair of upper NFETs M3, M4 are connected to the source of the first lower NFET M1, and where the drains of the second pair of upper NFETs M5, M6 are connected to the source of the second lower NFET M2. The source of the first NFET M3 in the first pair of upper NFETs M3, M4 is connected to the source of the first NFET M5 in the second pair of upper NFETs M5, M6. The source of the second NFET M4 in the first pair of upper NFETs M3, M4 is connected to the source of the second NFET M6 in the second pair of upper NFETs M5, M6. The gates of the first pair of upper NFETs M3, M4 and the second pair of upper NFETs M5, M6 each receive a control input from control logic 111 so that each of the NFETs M3, M4, M5, and M6 may be individually controlled (i.e., individually turned on or off) to configure the LNA 100 in either normal, or non-carrier aggregation, mode or carrier aggregation mode, as described below. The first pair of upper NFETs M3, M4 and the first lower NFET M1 form a first symmetrical half circuit. The second pair of upper NFETs M5, M6 and the second lower NFET M2 form a second symmetrical half circuit.

A first balun 501 is connected to the sources of the first NFETs M3, M5 of the first pair of upper NFETs M3, M4 and the second pair of upper NFETs M5, M6 for converting a single-ended RF input to a differential output. The differential output of the first balun is connected to a first mixer 505. The first mixer 505 has an input for receiving a signal of a user-definable frequency from a first local oscillator $LO_1$, where the frequency of the signal from the first local oscillator is used to select one or more component carriers from the output of the LNA 500. The first mixer 505 may be a passive double balanced magnitude (I) and phase (Q) mixer. However, any other type of mixer may be used.

A second balun 503 is connected to the sources of the second NFETs M4, M6 of the first pair of upper NFETs M3, M4 and the second pair of upper NFETs M5, M6 for converting a single-ended RF input to a differential output. The differential output of the second balun is connected to a second mixer 507. The second mixer 507 has an input for receiving a signal of a user-definable frequency from a second local oscillator $LO_2$, where the frequency of the signal from the second local oscillator is used to select one or more component carriers from the output of the LNA 500.

In carrier aggregation mode, the LNA 500 processes a plurality of component carriers and transmits them to mixers. At each mixer, a Local Oscillator (LO) signal is chosen to select (i.e., pick up or down convert) a desired one or more component carriers from amongst the plurality of component carriers output by the LNA 500. If one mixer down-converts more than one component carrier and transmits the down-converted Intermediate Frequency (IF) signals to the selected baseband, then a more stringent performance requirement is placed on the analog baseband. For example, an Analog-to-Digital Converter (ADC) should have better dynamic range for processing multiple IF signals than for processing a single IF signal. This feature is very useful when closely spaced component carries are processed by an LNA 500, but requires the analog filtering to down convert multiple RF carriers using a single LO signal. Then, carrier separation may be done in the digital domain. Thus, a single LNA having two symmetrical half circuits may process more than two component carriers, so long as subsequent circuitry can process multiple component carrier Intermediate Frequencies (IFs).

The first upper pair of NFETs M3, M4 and the second upper pair of NFETs M5, M6 are either turned on or off by applying an appropriate voltage (e.g., a high, logic 1 voltage referred to as VDD or a low, logic 0 voltage referred to as ground or GND) to the gates of the first and second upper pairs of NFETs M3, M4, and M5, M6 via a control input.

In normal mode (i.e., non-carrier aggregation mode), there is only a single carrier received by the antenna 509. Thus, only one of the first mixer 505 or the second mixer 507 is needed to process the carrier. The variable inductor 101 is programmed to the normal larger value to provide desired gain, input matching, and noise figure. The first variable capacitor 103 and the second variable capacitor 105 are each programmed for the same purpose. $V_{BIAS1}$ and $V_{BIAS2}$ are connected to a single bias circuit. Therefore, the bias current in the first lower NFET M1 and the bias current in the second lower NFET M2 are controlled by the same control signal. Finally, the first upper pair of NFETs M3, M4 and the second upper pair of NFETs M5, M6 are programmed such that the currents of both the first lower NFET M1 and the second lower NFET M2 go to either the first mixer 505 or the second mixer 507. That is, one output current of the LNA 500 may be directed to the source of NFET M3 of the first upper pair of NFETs M3, M4 (and the source of the first lower NFET M1) and the source of NFET M5 of the second upper pair of NFETs M5, M6 (and the source of the second lower NFET M2) by applying a high voltage to the gate of NFET M3 and the gate of NFET M5, while applying a low voltage to the gate of NFET M4 and the gate of NFET M6. Alternatively, one output current of the LNA 500 may be directed to the source of M4 of the first upper pair of NFETs M3, M4 (and the source of the first lower NFET M1) and the source of NFET M6 of the second upper pair of NFETs M5, M6 (and the source of the second lower NFET M2), by applying a high voltage to the gate of NFET M4 and the gate of NFET M6, while applying a low voltage to the gate of NFET M3 and the gate of NFET M5.

In carrier aggregation mode, assuming two component carriers are received by the antenna 509, both the first mixer 505 and the second mixer 507 are enabled such that each mixer processes one of the component carriers. The variable inductor 101 is programmed to a smaller value so as to maintain the similar gain and input matching as in normal mode, and to maintain good noise figure. The first variable capacitor 103 and the second variable capacitor 105 may be programmed for the same purpose. $V_{BIAS1}$ and $V_{BIAS2}$ come from two identical but independent bias circuits, therefore, the bias current in the first lower NFET M1 and the second lower NFET M2 are independently controlled. Finally, the first upper pair of NFETs M3, M4, which also function as LNA 500 output current switches, are programmed such that the M1 device current goes to the first mixer 505 and the M2 device current goes to the second mixer 507. The gain of first symmetrical half circuit is independently controlled by the diverting (bleeding) fraction of the first diverting NFET M7 described below. Similarly, the gain of the second symmetrical half circuit is independently controlled by the diverting (bleeding) fraction of the second diverting NFET M8 described below. In this configuration, the input matching transistor has the same size as in normal mode, so a good input matching is maintained by using the same external input matching network as in normal mode. This proposed principle may be extended to any multiple of component carriers.

In carrier aggregation mode, one output current of the LNA 500 is directed to the source of NFET M3 of the first upper pair of NFETs M3, M4 (and the source of the first lower NFET M1) and a second output current of the LNA 500 is directed to the source NFET M6 of the second upper pair of NFETs M5, M6 (and the source of the second lower NFET M2) by applying a high voltage to the gate of NFET M3 and the gate of NFET M6, while applying a low voltage to the gate of NFET M4 and the gate of NFET M5. The first output current and the second output current may each contain one or more component carriers, which are converted to baseband. If each output current contains one component carrier, then the LNA 500 processes two aggregated component carriers. However, the present invention is not limited to processing just two aggregated component carriers, where each symmetrical half circuit processes one output current containing one component carrier. Additional aggregated component carriers may be processed by the present invention by either including more than one component carrier in an output current or adding additional symmetrical half circuits, as illustrated in FIG. 6 and described below, to process additional output currents, where an additional output current may contain one or more component carriers.

The LNA 500 of FIG. 5 includes a variable inductor 101 connected between the drains of the first lower NFET M1 and the second lower NFET M2 and a low voltage (e.g., GND), where the variable inductor 101 receives a control input from control logic 111 for varying the value of the variable inductor 101. The variable inductor 101 acts as a switched source degenerating inductor. In normal mode, the variable inductor 101 has a first value when the control input has a first value (e.g., a low voltage GND or logic 0). In carrier aggregation mode, the variable inductor 101 has a second value that is less than the first value when the control input has a second value (e.g., a high voltage VDD or logic 1). Different values may be used for the control input to achieve the same result (e.g., VDD for the first value of the variable inductor 101 and GND for the second value of the variable inductor 101). In carrier aggregation mode, the second value of the variable inductor 101 provides optimal LNA 500 input impedance matching, gain, and noise figure.

The LNA 500 includes a first variable capacitor 103 connected between the gate and the drain of the first lower NFET M1, where the first variable capacitor 103 receives a control input for varying the value of the first variable capacitor 103. The first variable capacitor 103 acts as a switched source degenerating capacitor. In normal mode, the first variable capacitor 103 has a first value. In carrier aggregation mode, the first variable capacitor 103 has a second value that is lower than the first value of the first variable capacitor 103. Alternatively, the first variable capacitor 103 may have a fixed value for both normal mode and carrier aggregation mode. However, to process a wider RF frequency range using a single LNA 500, a first variable capacitor 103 having a first value and a second value is preferred to provide good LNA 500 input matching and noise figure. In normal mode, the first variable capacitor 103 has a first value when the control input has a first value (e.g., a low voltage GND or logic 0). In carrier aggregation mode, the first variable capacitor 103 has a second value that is less than the first value when the control input has a second value (e.g., a high voltage VDD or logic 1). Different values may be used for the control input to achieve the same result (e.g., VDD for the first value of the first variable capacitor 103 and GND for the second value of the first variable capacitor 103).

The LNA 500 includes a second variable capacitor 105 connected between the gate and the drain of the second lower NFET M2, where the second variable capacitor 105 receives a control input for varying the value of the second variable capacitor 105. The second variable capacitor 105 acts as a switched source degenerating capacitor. In normal mode, the second variable capacitor 105 has a first value. In carrier aggregation mode, the second variable capacitor 105 has a second value that is lower than the first value of the second variable capacitor 105. Alternatively, the second variable capacitor 105 may have a fixed value for both normal mode and carrier aggregation mode. However, to process a wider RF frequency range using a single LNA 500, a second variable capacitor 105 having a first value and a second value is preferred to provide good LNA 500 input matching and noise figure. In normal mode, the second variable capacitor 105 has a first value when the control input has a first value (e.g., a low voltage GND or logic 0). In carrier aggregation mode, the second variable capacitor 105 has a second value that is less than the first value when the control input has a second value (e.g., a high voltage VDD or logic 1). Different values may be used for the control input to achieve the same result (e.g., VDD for the first value of the second variable capacitor 105 and GND for the second value of the second variable capacitor 105).

The LNA 500 includes a first diverting NFET M7 and a first diverting impedance Z1 107. The drain of the first diverting NFET M7 is connected to the drains of the first upper pair of NFETS M3, M4. The first diverting impedance Z1 107 is connected between the source of the first diverting NFET M7 and a high voltage (e.g., VDD). The gate of the first diverting NFET M7 receives a control input from control logic 111 for diverting, or bleeding off, a fraction of the current in the first symmetrical half circuit formed by the first pair of upper NFETs M3, M4 and the first lower NFET M1. The fraction of current diverted by the first diverting NFET M7 and the first diverting impedance 107 depends on the degree to which the first diverting NFET M7 is turned on by the control input and the value of the first diverting impedance Z1 107. The first diverting impedance Z1 107 may be any device that has an impedance (e.g., a passive component such as a resistor formed in any material having a resistance, an active component such an NFET connected in a diode configuration, etc.). The amount of current diverted from the first symmetrical half circuit affects the gain of the first symmetrical half circuit (i.e., the more current diverted the lower the gain).

The LNA 500 includes a second diverting NFET M8 and a second diverting impedance Z2 109. The drain of the second diverting NFET M8 is connected to the drains of the second upper pair of NFETS M5, M6. The second diverting impedance Z2 109 is connected between the source of the second diverting NFET M8 and a high voltage (e.g., VDD). The gate of the second diverting NFET M8 receives a control input from control logic 111 for diverting, or bleeding off, a fraction of the current in the second symmetrical half circuit formed by the second pair of upper NFETs M5, M6 and the second lower NFET M2. The fraction of current diverted by the second diverting NFET M8 and the second diverting impedance Z2 109 depends on the degree to which the second diverting NFET M8 is turned on by the control input and the value of the second diverting impedance Z2 109. The second diverting impedance Z2 109 may be any static component or active device that has an impedance (e.g., a passive component such as a resistor formed in any material having a resistance, an active component such as an NFET connected in a diode configuration, etc.). The amount of current diverted from the second symmetrical half circuit affects the gain of the second symmetrical half circuit (i.e., the more current diverted the lower the gain).

The control inputs to the first diverting NFET M7 and the second diverting NFET M8 are independently controlled, which enables the gain of the first symmetrical half circuit and the gain of the second symmetrical half circuit to be independently controlled.

The LNA 500 includes control logic 111 having an output bus that provides individual control inputs for each of the first pair of upper NFETs M3, M4, each of the second pair of upper NFETs M5, M6, the variable inductor 101, the first variable capacitor 103, the second variable capacitor 105, the first diverting NFET M7, and the second diverting NFET M8. The control logic 111 controls the mode (i.e., normal mode or carrier aggregation mode), the bias current, and the gain of the LNA 500.

FIG. 6 is a schematic diagram of an n-channel Low Noise Amplifier (LNA) 600 according to an embodiment of the present invention that illustrates n processing channels, where n is a user defined integer. In aggregation mode, each channel in the LNA 600 may process either one of the aggregated component carriers or more than one of the component carriers.

Referring to FIG. 6, the LNA 600 includes a first lower NFET M1, a second lower NFET M2, and a third lower NFET M3, where the pattern repeats for n channels. The first lower NFET M1, the second lower NFET M2, and the third lower NFET M3 are connected via their drains, where the pattern repeats for n channels. NFETs are described for illustrative purposes only, and the present invention is not limited to an LNA 600 that uses only NFETs. The LNA 600 of the present invention may be implemented in either PFET or CMOS technology.

The first lower NFET M1 is independently biased with a DC voltage via a first resistor R1, which is connected between a first bias voltage $V_{BIAS1}$ and the gate of the first lower NFET M1. The first lower NFET M1 is also AC coupled to an RF input via a first capacitor C1, which is connected between the RF input and the gate of the first lower NFET M1. The first lower NFET M1 acts as a transconductor, which converts an RF input voltage to a current. In LTE Advanced, the RF input signal may contain one component carrier in normal mode or more than one component carrier in carrier aggregation mode.

The second lower NFET M2 is independently biased with a DC voltage via a second resistor R2, which is connected between a second bias voltage $V_{BIAS2}$ and the gate of the second lower NFET M2. The second lower NFET M2 is also AC coupled to the RF input via a second capacitor C2, which is connected between the RF input and the gate of the second lower NFET M2. The second lower NFET M2 acts as a transconductor, which converts the RF input voltage to a current.

The third lower NFET M3 is independently biased with a DC voltage via a third resistor R3, which is connected between a third bias voltage $V_{BIAS3}$ and the gate of the third lower NFET M3. The third lower NFET M3 is also AC coupled to the RF input via a third capacitor C3, which is connected between the RF input and the gate of the third lower NFET M3. The third lower NFET M3 acts as a transconductor, which converts the RF input voltage to a current. The pattern repeats for n channels.

The values of $V_{BIAS1}$, $V_{BIAS2}$, and $V_{BIAS3}$ are individually chosen so that the bias currents of the first lower NFET M1, the second lower NFET M2, and the third lower NFET M3 are independently controlled. That is, the bias currents of the first lower NFET M1, the second lower NFET M2, and the third lower NFET M3 may be the same as, or different from, each other, depending on the values chosen for $V_{BIAS1}$, $V_{BIAS2}$, and $V_{BIAS3}$.

The LNA 600 includes a first group of upper NFETs M4, M5, M6, a second group of upper NFETs M7, M8, M9, and third group of upper NFETs M10, M11, M12, where the drains of the first group of upper NFETs M4, M5, M6 are connected to the source of the first lower NFET M1, where the drains of the second group of upper NFETs M7, M8, M9 are connected to the source of the second lower NFET M2, and where the drains of the third group of upper NFETs M10, M11, M12 are connected to the source of the third lower NFET M3. Note that the number of NFETs in each group is equal to the number of channels in the LNA 600. The source of the first NFET M4 in the first group of upper NFETs M4, M5, M6 is connected to the source of the first NFET M7 in the second group of upper NFETs M7, M8, M9 and the source of the first NFET M10 in the third group of upper NFETs M10, M11, M12. The source of the second NFET M5 in the first group of upper NFETs M4, M5, M6 is connected to the source of the second NFET M8 in the second group of upper NFETs M7, M8, M9 and the source of the second NFET M12 in the third group of upper NFETs M10, M11, M12. The source of the third NFET M6 in the first group of upper NFETs M4, M5, M6 is connected to the source of the third NFET M9 in the second group of upper NFETs M7, M8, M9 and the source of the third NFET M11 in the third group of upper NFETs M10, M11, M12. The pattern repeats for n channels. The gates of the first group of upper NFETs M4, M5, M6, the second group of upper NFETs M7, M8, M9, and the third group of upper NFETs M10, M11, M12 each receive a control input from control logic 615 so that each of the NFETs M4, M5, M6, M7, M8, M9, M10, M11, and M12 may be individually controlled (i.e., individually turned on or off) to configure the LNA 600 in either normal, or non-carrier aggregation, mode or carrier aggregation mode, as described below. The first group of upper NFETs M4, M5, M6 and the first lower NFET M1 form a first symmetrical half circuit. The second group of upper NFETs M7, M8, M9 and the second lower NFET M2 form a second symmetrical half circuit. The third group of upper NFETs M10, M11, M12 and the third lower NFET M3 form a third symmetrical half circuit. The pattern repeats for n symmetrical half circuits.

The first group of upper NFETs M4, M5, M6, the second group of upper NFETs M7, M8, M9, and the third group of upper NFETs M10, M11, M12 are either turned on or off by applying an appropriate voltage (e.g., a high, logic 1 voltage referred to as VDD or a low, logic 0 voltage referred to as ground or GND) to the gates of the first, second, and third groups of upper NFETs M4, M5, M6, M7, M8, M9, M10, M11, M12 via a control input. The pattern repeats for n channels.

In normal mode (i.e., non-carrier aggregation mode), one output current of the LNA 600 is directed to the source of NFET M4 of the first group of upper NFETs M4, M5, M6 (and the source of the first lower NFET M1), the source of NFET M7 of the second group of upper NFETs M7, M8, M9 (and the source of the second lower NFET M2), and the source of NFET M10 of the third group of upper NFETs M10, M11, M12 (and the source of the third lower NFET M3) by applying a high voltage to the gate of NFET M4, the gate of NFET M7, and the gate of NFET M10 while applying a low voltage to the gate of NFET M5, the gate of NFET M6, the gate of NFET M8, the gate of NFET M9, the gate of NFET M11, and the gate of NFET M12.

In normal mode (i.e., non-carrier aggregation mode), one output current of the LNA 600 may also be directed to the source of NFET M5 of the first group of upper NFETs M4, M5, M6 (and the source of the first lower NFET M1), the source of NFET M8 of the second group of upper NFETs M7, M8, M9 (and the source of the second lower NFET M2), and the source of NFET M12 of the third group of upper NFETs M10, M11, M12 (and the source of the third lower NFET M3) by applying a high voltage to the gate of NFET M5, the gate of NFET M8, and the gate of NFET M12 while applying a low voltage to the gate of NFET M4, the gate of NFET M6, the gate of NFET M7, the gate of NFET M9, the gate of NFET M10, and the gate of NFET M11.

In normal mode (i.e., non-carrier aggregation mode), one output current of the LNA 600 may also be directed to the source of NFET M6 of the first group of upper NFETs M4, M5, M6 (and the source of the first lower NFET M1), the source of NFET M9 of the second group of upper NFETs M7, M8, M9 (and the source of the second lower NFET M2), and the source of NFET M11 of the third group of upper NFETs M10, M11, M12 (and the source of the third lower NFET M3) by applying a high voltage to the gate of NFET M6, the gate of NFET M9, and the gate of NFET M11 while applying a low voltage to the gate of NFET M4, the gate of NFET M5, the gate of NFET M7, the gate of NFET M8, the gate of NFET M10, and the gate of NFET M12. The pattern repeats for n channels.

In carrier aggregation mode, one output current of the LNA 600 is directed to the source of NFET M4 of the first group of upper NFETs M4, M5, M6 (and the source of the first lower NFET M1), a second output current of the LNA 600 is directed to the source NFET M9 of the second group of upper NFETs M7, M8, M9 (and the source of the second lower NFET M2), and a third output current of the LNA 600 is directed to the source NFET M12 of the third group of upper NFETs M10, M11, M12 (and the source of the third lower NFET M3) by applying a high voltage to the gate of NFET M4, the gate of NFET M9, and the gate of NFET M12, while applying a low voltage to the gates of NFETs M5, M6, M7, M8, M10, and M11. The pattern repeats for n channels. The first output current, the second output current, and the third output may each contain one or more component carriers, which may be converted to baseband as described above with reference to FIG. 5. If each output current contains one component carrier, then the LNA 600 of FIG. 6 processes three aggregated component carriers of the three channels shown, but can process up to n aggregated component carriers, if the pattern is repeated for n channels. However, the present invention is not limited to processing just n aggregated component carriers, where each symmetrical half circuit processes one output current containing one component carrier. Additional aggregated component carriers may be processed by the present invention by including more than one component carrier in an output current.

The LNA 600 includes a variable inductor 101 connected between the drains of the first lower NFET M1, the second lower NFET M2, and the third lower NFET M3 and a low voltage (e.g., GND), where the variable inductor 101 receives a control input from control logic 615 for varying the value of the variable inductor 101. The variable inductor 101 acts as a switched source degenerating inductor. In normal mode, the variable inductor 101 has a first value when the control input has a first value (e.g., a low voltage GND or logic 0). In carrier aggregation mode, the variable inductor 101 has a second value that is less than the first value when the control input has a second value (e.g., a high voltage VDD or logic 1). Different values may be used for the control input to achieve the same result (e.g., VDD for the first value of the variable inductor 101 and GND for the second value of the variable inductor 101). In carrier aggregation mode, the second value of the variable inductor 101 provides optimal LNA 600 input impedance matching, gain, and noise figure.

The LNA 600 includes a first variable capacitor 103 connected between the gate and the drain of the first lower NFET M1, where the first variable capacitor 103 receives a control input from control logic 615 for varying the value of the first variable capacitor 103. The first variable capacitor 103 acts as a switched source degenerating capacitor. In normal mode, the first variable capacitor 103 has a first value. In carrier aggregation mode, the first variable capacitor 103 has a second value that is lower than the first value of the first variable capacitor 103. Alternatively, the first variable capacitor 103 may have a fixed value for both normal mode and carrier aggregation mode. However, to process a wider RF frequency range using a single LNA 600, a first variable capacitor 103 having a first value and a second value is preferred to provide good LNA 600 input matching and noise figure. In normal mode, the first variable capacitor 103 has a first value when the control input has a first value (e.g., a low voltage GND or logic 0). In carrier aggregation mode, the first variable capacitor 103 has a second value that is less than the first value when the control input has a second value (e.g., a high voltage VDD or logic 1). Different values may be used for the control input to achieve the same result (e.g., VDD for the first value of the first variable capacitor 103 and GND for the second value of the first variable capacitor 103).

The LNA 600 includes a second variable capacitor 105 connected between the gate and the drain of the second lower NFET M2, where the second variable capacitor 105 receives a control input from control logic 615 for varying the value of the second variable capacitor 105. The second variable capacitor 105 acts as a switched source degenerating capacitor. In normal mode, the second variable capacitor 105 has a first value. In carrier aggregation mode, the second variable capacitor 105 has a second value that is lower than the first value of the second variable capacitor 105. Alternatively, the second variable capacitor 105 may have a fixed value for both normal mode and carrier aggregation mode. However, to process a wider RF frequency range using a single LNA 600, a second variable capacitor 105 having a first value and a second value is preferred to provide good LNA 600 input matching and noise figure. In normal mode, the second variable capacitor 105 has a first value when the control input has a first value (e.g., a low voltage GND or logic 0). In carrier aggregation mode, the second variable capacitor 105 has a second value that is less than the first value when the control input has a second value (e.g., a high voltage VDD or logic 1). Different values may be used for the control input to achieve the same result (e.g., VDD for the first value of the second variable capacitor 105 and GND for the second value of the second variable capacitor 105).

The LNA 600 includes a third variable capacitor 607 connected between the gate and the drain of the third lower NFET M3, where the third variable capacitor 607 receives a control input from control logic 615 for varying the value of the third variable capacitor 607. The third variable capacitor 607 acts as a switched source degenerating capacitor. In normal mode, the third variable capacitor 607 has a first value. In carrier aggregation mode, the third variable capacitor 607 has a second value that is lower than the first value of the third variable capacitor 607. Alternatively, the third variable capacitor 607 may have a fixed value for both normal mode and carrier aggregation mode. However, to cover a wider RF frequency range using a single LNA 600, a third variable capacitor 607 having a first value and a second value is preferred to provide good LNA 600 input matching and noise figure. In normal mode, the third variable capacitor 607 has a first value when the control input has a first value (e.g., a low voltage GND or logic 0). In carrier aggregation mode, the third variable capacitor 607 has a second value that is less than the first value when the control input has a second value (e.g., a high voltage VDD or logic 1). Different values may be used for the control input to achieve the same result (e.g., VDD for the first value of the third variable capacitor 607 and GND for the second value of the third variable capacitor 607). The pattern repeats for n channels.

The LNA 600 includes a first diverting NFET M13 and a first diverting impedance Z1 609. The drain of the first diverting NFET M13 is connected to the drains of the first group of upper NFETS M4, M5, M6. The first diverting impedance Z1 609 is connected between the source of the first diverting NFET M13 and a high voltage (e.g., VDD). The gate of the first diverting NFET M13 receives a control input from control logic 615 for diverting, or bleeding off, a fraction of the current in the first symmetrical half circuit formed by the first group of upper NFETs M4, M5, M6 and the first lower NFET M1. The fraction of current diverted by the first diverting NFET M13 and the first diverting impedance Z1 609 depends on the degree to which the first diverting NFET M13 is turned on by the control input and the value of the first diverting impedance Z1 609. The first diverting impedance Z1 609 may be any device that has an impedance (e.g., a passive component such as a resistor formed in any material having a resistance, an active component such as an NFET connected as a diode, etc.). The amount of current diverted from the first symmetrical half circuit affects the gain of the first symmetrical half circuit (i.e., the more current diverted the lower the gain).

The LNA 600 includes a second diverting NFET M14 and a second diverting impedance Z2 611. The drain of the second diverting NFET M14 is connected to the drains of the second group of upper NFETS M7, M8, M9. The second diverting impedance Z2 611 is connected between the source of the second diverting NFET M14 and a high voltage (e.g., VDD). The gate of the second diverting NFET M14 receives a control input from control logic 615 for diverting, or bleeding off, a fraction of the current in the second symmetrical half circuit formed by the second group of upper NFETs M7, M8, M9 and the second lower NFET M2. The fraction of current diverted by the second diverting NFET M14 and the second diverting impedance Z2 611 depends on the degree to which the second diverting NFET M14 is turned on by the control input and the value of the second diverting impedance Z2 611. The second diverting impedance Z2 611 may be any device that has an impedance (e.g., a passive component such as a resistor formed in any material having a resistance, an active component such as an NFET connected as a diode, etc.). The amount of current diverted from the second symmetrical half circuit affects the gain of the second symmetrical half circuit (i.e., the more current diverted the lower the gain).

The LNA 600 includes a third diverting NFET M15 and a third diverting impedance Z3 613. The drain of the third diverting NFET M15 is connected to the drains of the third group of upper NFETS M10, M11, M12. The third diverting impedance Z3 613 is connected between the source of the third diverting NFET M15 and a high voltage (e.g., VDD). The gate of the third diverting NFET M15 receives a control input from control logic 615 for diverting, or bleeding off, a fraction of the current in the third symmetrical half circuit formed by the third group of upper NFETs M10, M11, M12 and the third lower NFET M3. The fraction of current diverted by the third diverting NFET M15 and the third diverting impedance Z3 613 depends on the degree to which the third diverting NFET M15 is turned on by the control input and the value of the third diverting impedance Z3 613. The third diverting impedance Z3 613 may be any device that has an impedance (e.g., a static component such a resistor formed in any material having a resistance or an active component such as an NFET that has an impedance). The amount of current diverted from the third symmetrical half circuit affects the gain of the third symmetrical half circuit (i.e., the more current diverted the lower the gain). The pattern repeats for n channels.

The control inputs to the first diverting NFET M13, the second diverting NFET M14, and the third diverting NFET M15 are independently controlled, which enables the gains of the first symmetrical half circuit, the second symmetrical half circuit, and the third symmetrical half circuit to be independently controlled.

The LNA 600 includes control logic 615 having an output bus that provides individual control inputs for each of the first group of upper NFETs M4, M5, M6, each of the second group of upper NFETs M7, M8, M9, and each of the third group of upper NFETs M10, M11, and M12, the variable inductor 101, the first variable capacitor 103, the second variable capacitor 105, the third variable capacitor 607, the first diverting NFET M13, the second diverting NFET M14, and the third diverting NFET M15. The pattern repeats for n channels. The control logic 615 controls mode (i.e., normal mode or carrier aggregation mode), bias current, and gain.

The LNA 600 may be integrated into a receiver. In addition, an array of LNAs 600 may be interconnected to an array of mixers and baseband analog blocks, where any RF input signal, either in CA mode or normal mode, may be routed to any mixer and baseband analog block. Multiple RF carriers from a receiving antenna may be processed by a single LNA 600 in CA mode.

Although the embodiments of the present invention have been described in the detailed description of the present disclosure, the present invention may be modified in various forms without departing from the scope of the present invention. Thus, the scope of the present invention shall not be determined merely based on the described embodiments, but rather determined based on the accompanying claims and equivalents thereto.

What is claimed is:

1. A low noise amplifier for carrier aggregation and non-carrier aggregation, comprising:
    a plurality of symmetrical half circuits;
    a plurality of bias circuits, where each of the plurality of bias circuits is connected to one of the plurality of symmetrical half circuits;
    a plurality of capacitors, where each of the plurality of capacitors is connected to one of the plurality of symmetrical half circuits for Alternating Current (AC) coupling an RF signal containing at least one component carrier; and
    a control logic circuit connected to each of the plurality of symmetrical half circuits for configuring the low noise amplifier to process one component carrier or a plurality of component carriers.

2. The low noise amplifier of claim 1, wherein the plurality of symmetrical half circuits are implemented with field effect transistors selected from n-channel field effect transistors (NFETs), p-channel field effect transistors (PFETs), or a combination of NFETs and PFETs in Complementary Metal Oxide Semiconductor (CMOS) technology.

3. The low noise amplifier of claim 2, wherein each of the plurality of symmetrical half circuits comprises:
    a lower NFET, having a source, a gate, and a drain, where the gate of the lower NFET is connected to one of the plurality of bias circuits and a first end of one of the plurality of capacitors, and where a second end of the one of the plurality of capacitors receives the RF signal;
    a plurality of upper NFETs, where the plurality of upper NFETs is equal to the plurality of symmetrical half circuits in the low noise amplifier, where each of the plurality of upper NFETs has a source, a gate, and a drain, where the source of one of the plurality of upper NFETs is an output of the low noise amplifier, where the output of the low noise amplifier is connected to a source of an upper NFET of each of the other symmetrical half circuits in the low noise amplifier that is an output of the other symmetrical half circuit, respectively, where the source of each other NFET in the plurality of upper NFETs is connected to a source of an upper NFET of each of the other symmetrical half circuits in the low noise amplifier that is not an output of the other symmetrical half circuit, respectively, and where the drains of the plurality of upper NFETs are connected to the source of the lower NFET; and
    a variable inductor, having a first end connected to the drain of the lower NFET, having a second end connected to a ground voltage, and having a control input connected to the control logic circuit for receiving a signal to vary the variable inductor from a first inductance when the low noise amplifier processes one component carrier to a second inductance when the low noise amplifier processes a plurality of component carriers, where the second inductance is lower than the first inductance.

4. The low noise amplifier of claim 3, wherein each of bias circuits comprises:
a resistor, having a first end connected to the gate of the lower NFET, and having a second end; and
an independently variable Direct Current (DC) voltage source connected to the second end of the resistor.

5. The low noise amplifier of claim 3, wherein each of the plurality of symmetrical half circuits further comprises a variable capacitor, having a first end connected to the gate of the lower NFET, having a second end connected to the drain of the lower NFET, and having a control input connected to the control logic circuit for receiving a signal to vary the variable capacitor from a first capacitance, when the low noise amplifier processes one component carrier, to a second capacitance, when the low noise amplifier processes a plurality of component carriers, where the second capacitance is lower than the first capacitance.

6. The low noise amplifier of claim 3, wherein the variable inductor comprises:
a first inductance, having a first end and a second end;
a second inductance, having a first end connected to the second end of the first inductance, and having a second end;
an NFET, having a source connected to the first end of the first inductance;
having a gate for receiving a control input to vary the inductance of the variable inductor from the inductance value of the first inductance and the inductance of the first inductance in parallel with the second inductance, and having a drain connected to the second end of the second inductance.

7. The low noise amplifier of claim 6, wherein the first inductance and the second inductance are each realized by stacked layers of metal in an integrated circuit.

8. The low noise amplifier of claim 3, wherein the variable capacitor comprises:
n capacitors, each having a first end and a second end, wherein the first ends of the n capacitors are connected to each other, where n is a user-defined integer;
n NFETs, each having a source, wherein the sources of the n NFETs are connected to each other, each having a gate for receiving a control input to vary the capacitance of the variable capacitor from a first sum of at least one of the n capacitors to a second sum of at least one of the n capacitors, where the second sum is smaller than the first sum, and each having a drain connected to the second end of one of the n capacitors.

9. The low noise amplifier of claim 2, wherein each field effect transistor is realized by an array of n field effect transistors connected in parallel, where n is a user-defined integer.

10. The low noise amplifier of claim 9, wherein a width and a length of each field effect transistor is selected for setting an operating frequency range of the low noise amplifier.

11. The low noise amplifier of claim 10, wherein the width and the length of each field effect transistor is selected for setting an operating frequency range of the low noise amplifier in the range of from 700 MHz to 1500 MHz, 1700 MHz to 2300 MHz, or 2300 MHz to 2700 MHz.

12. The low noise amplifier of claim 1, wherein each of the plurality of symmetrical half circuits further comprises a gain control circuit, comprising:

an impedance, having a first end connected to a logic one power supply voltage, and having a second end; and
a diverting field effect transistor, having a source (or drain) connected to the second end of the impedance, having a gate connected to the control logic for receiving a control input to control the gain of the low noise amplifier, and a drain (or source) connected to the drains of the plurality of upper NFETs in one of the symmetrical half circuits.

13. The low noise amplifier of claim 12, wherein the impedance is realized by a passive electrical component or an active electrical component.

14. The low noise amplifier of claim 1, further comprising:
a plurality of baluns connected to each of the plurality of symmetrical half circuits, respectively; and
a plurality of mixers connected to the plurality of baluns, respectively, wherein each of the plurality of mixers has an input for receiving a local oscillator signal for processing at least one component carrier.

15. A method of low noise amplification in non-carrier aggregation mode, comprising:
directing one output current of a low noise amplifier to a source of one NFET of a first group of upper NFETs, a source of a first lower NFET, a source of one NFET of a second group of upper NFETs, a source of a second lower NFET, a source of one NFET of a third group of upper NFETs, and a source of a third lower NFET by applying a logic 1 voltage to a gate of the one NFET of the first group of upper NFETs, a gate of the one NFET of the second group of upper NFETs, and a gate of the one NFET of the third group of upper NFETs, while applying a logic 0 voltage to gates of the other NFETs in the first group of upper NFETs, gates of the other NFETs in the second group of upper NFETs, and gates of the other NFETs in the third group of upper NFETs.

16. The method of claim 15, wherein the method repeats for n symmetrical half circuits, where n is a user-defined integer.

17. A method of low noise amplification in carrier aggregation mode, comprising:
directing one output current of a low noise amplifier to a source of one NFET of a first group of upper NFETs and a source of a first lower NFET;
directing a second output current of the low noise amplifier to a source of one NFET of a second group of upper NFETs and a source of a second lower NFET; and
directing a third output current of the low noise amplifier to a source of one NFET of a third group of upper NFETs and a source of the third lower NFET, by applying a logic 1 voltage to a gate of the one NFET in the first group of upper NFETs, a gate of the one NFET of the second group of upper NFETs, and a gate of the one NFET of the third group of upper NFETs, while applying a logic 0 voltage to gates of the other NFETs in the first group of upper NFETs, gates of the other NFETs in the second group of upper NFETs, and gates of the other NFETs in the third group of upper NFETs.

18. The method of claim 17, wherein the method repeats for n symmetrical half circuits, where n is a user-defined integer.

19. The method of claim 17, wherein each current contains one component carrier.

20. The method of claim 17, wherein at least one of the currents contains a plurality of component carriers.

* * * * *